US008551393B2

(12) United States Patent
Kobayashi

(10) Patent No.: US 8,551,393 B2
(45) Date of Patent: Oct. 8, 2013

(54) PATTERNING METHOD AND METHOD FOR MANUFACTURING SEMICONDUCTOR DEVICE

(75) Inventor: Yoshihito Kobayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 646 days.

(21) Appl. No.: 12/836,684

(22) Filed: Jul. 15, 2010

(65) Prior Publication Data

US 2011/0034012 A1 Feb. 10, 2011

(30) Foreign Application Priority Data

Aug. 4, 2009 (JP) ................................ 2009-181362

(51) Int. Cl.
*B29C 35/08* (2006.01)

(52) U.S. Cl.
USPC ........................................................ 264/494

(58) Field of Classification Search
USPC ........................................................ 264/494
See application file for complete search history.

(56) References Cited

U.S. PATENT DOCUMENTS

| | | | | |
|---|---|---|---|---|
| 6,517,995 | B1 * | 2/2003 | Jacobson et al. | 430/320 |
| 2009/0039563 | A1 | 2/2009 | Okinaka et al. | |

FOREIGN PATENT DOCUMENTS

| | | |
|---|---|---|
| JP | 5-177706 | 7/1993 |
| JP | 7-117201 | 5/1995 |
| JP | 2005-283628 | 10/2005 |
| JP | 2008-23868 | 2/2008 |
| JP | 2008-30241 | 2/2008 |
| WO | WO 2007/026605 | 3/2007 |

OTHER PUBLICATIONS

Notification of Reason(s) for Refusal issued by the Japanese Patent Office on Nov. 27, 2012, for Japanese Patent Application No. 2009-181362, and English-language translation thereof.

* cited by examiner

*Primary Examiner* — Yogendra Gupta
*Assistant Examiner* — John Robitaille
(74) *Attorney, Agent, or Firm* — Finnegan, Henderson, Farabow, Garrett & Dunner, L.L.P.

(57) ABSTRACT

In one embodiment, a patterning method is disclosed. The method includes applying an uncured imprint material containing a first curing agent and a second curing agent onto a substrate. The method includes pressing a template against the imprint material. The method includes reacting the first curing agent with the template pressed against the imprint material. The method includes stripping the template from the imprint material. In addition, the method includes reacting the second curing agent.

14 Claims, 2 Drawing Sheets

PATTERNING METHOD AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2009-181362, filed on Aug. 4, 2009; the entire contents of which are incorporated herein by reference.

FIELD

Embodiments described herein relate generally to a patterning method and a method for manufacturing a semiconductor device.

BACKGROUND

Conventionally, techniques have been developed for using the nano-imprint process to manufacture fine structures such as semiconductor devices. In the nano-imprint process, a resin material such as a resist is applied onto a substrate, and a template with an indentation pattern formed on the surface is pressed against this resist material. After the resist material is cured, the template is stripped from the resin material, and thereby the indentations formed in the template are transferred to the resin material. Thus, a pattern made of the resin material is formed (for instance, refer to JP-A 2008-23868 (Kokai)).

However, in the nano-imprint process, when the template is stripped from the resin material, the resin material adheres to the template, and part of the pattern made of the resin material may be torn off, or deformed due to a large frictional force generated between the resin material and the template. Thus, the pattern may be destroyed.

DETAILED DESCRIPTION

In one embodiment, a patterning method is disclosed. The method includes applying an uncured imprint material containing a first curing agent and a second curing agent onto a substrate. The method includes pressing a template against the imprint material. The method includes reacting the first curing agent with the template pressed against the imprint material. The method includes stripping the template from the imprint material. In addition, the method includes reacting the second curing agent.

In another embodiment, a method is disclosed for manufacturing a semiconductor device. The method includes forming a pattern on a semiconductor substrate and performing processing on the semiconductor substrate by using the pattern as a mask. The forming the pattern includes applying an uncured imprint material containing a first curing agent and a second curing agent onto the substrate. The forming includes pressing a template against the imprint material. The forming includes reacting the first curing agent with the template pressed against the imprint material. In addition, the method includes stripping the template from the imprint material, and reacting the second curing agent.

Embodiments of the invention will now be described with reference to the drawings.

A first embodiment of the invention is first described.

FIGS. 1A to 1C, 2A, and 2B are process sectional views illustrating a method for manufacturing a semiconductor device according to this embodiment.

This embodiment is an embodiment of a patterning method based on the nano-imprint process and a method for manufacturing a semiconductor device including this patterning method, and more particularly an embodiment based on a photo-imprint method.

Figure 1A:
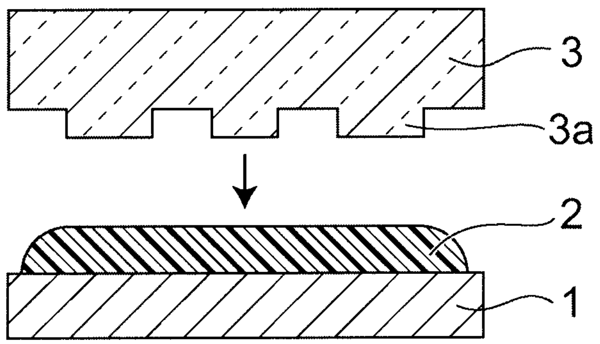
FIGS. 1A to 1C, 2A, and 2B are process sectional views illustrating a method for manufacturing a semiconductor device according to a first embodiment.

First, as shown in FIG. 1A, a semiconductor substrate 1 is prepared. The semiconductor substrate 1 is illustratively a silicon wafer. Then, an imprint material 2 is applied onto the semiconductor substrate 1. At this stage, the imprint material 2 is uncured and in a liquid state. The imprint material 2 is illustratively made of a photocurable material containing a first photosensitive material reacting upon irradiation of light of a wavelength of 365 nm (near-ultraviolet radiation) and a second photosensitive material reacting upon irradiation of light of a wavelength of 248 nm (ultraviolet radiation).

Then, a template 3 is pressed against the imprint material 2 from above. A prescribed fine pattern 3*a* is formed in the lower surface of the template 3. By the template 3 pressed against the imprint material 2 in the liquid state, part of the imprint material 2 enters the gaps of the fine pattern 3*a* of the template 3. The template 3 is formed from a material allowing transmission of the aforementioned light of a wavelength of 248 nm, such as quartz.

Figure 1B:
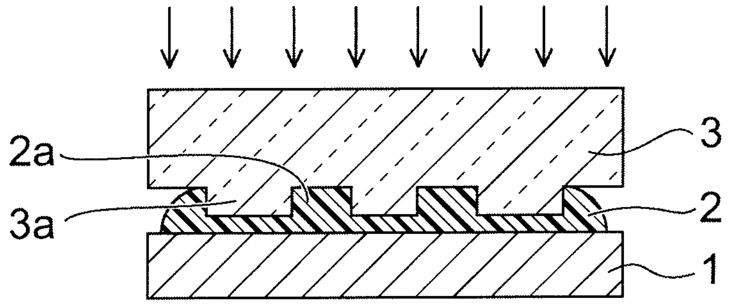

Next, as shown in FIG. 1B, with the template 3 pressed against the imprint material 2, the imprint material 2 is irradiated with light of a wavelength of 365 nm (near-ultraviolet radiation) via the template 3. This causes the first photosensitive material included in the imprint material 2 to react. At this time, because the second photosensitive material does not react, the imprint material 2 is turned into a semi-cured state. Thus, the fine pattern 3*a* is transferred to the imprint material 2 to form a fine pattern 2*a*.

In this specification, the "semi-cured state" refers to the state in which the curable material partially undergoes curing reaction, such as cross-linking reaction, and is not completely cured. However, it does not necessarily mean that the curing ratio (cross-linking ratio) is 50%, but refers to the state in which the curing ratio is generally 10-80%. If the imprint material 2 is in the semi-cured state, the imprint material does not adhere to a finger touching it, and the fine pattern 2*a* does not collapse even if the template 3 is pulled apart from the imprint material 2. The curing ratio in the semi-cured state can be controlled illustratively by the content of the first photosensitive material.

Figure 1C:
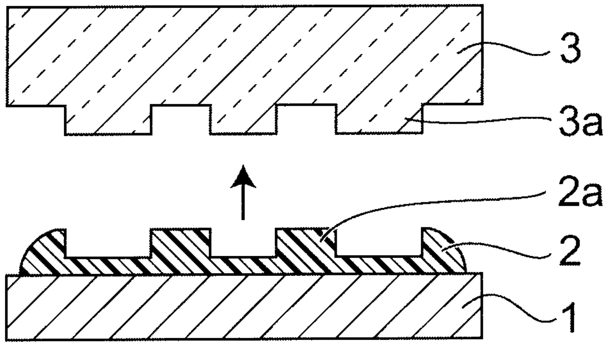

Next, as shown in FIG. 1C, the template 3 is stripped from the imprint material 2. At this time, because the imprint material 2 is in the semi-cured state, the shape of the fine pattern 2*a* is maintained even after the template 3 is stripped. Furthermore, because the imprint material 2 is in the semi-cured state, the imprint material 2 does not adhere to the template 3, or does not generate a large frictional force with respect to the template 3. Thus, the fine pattern 2*a* of the imprint material 2 is not destroyed in connection with stripping of the template 3.

Figure 2A:
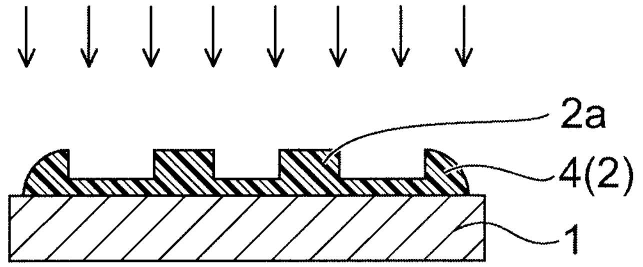

Next, as shown in FIG. 2A, the imprint material 2 is irradiated with light of a wavelength of 248 nm (ultraviolet radiation). This causes the second photosensitive material to react, and the imprint material 2 is turned into the fully cured state. Consequently, a resin pattern 4 made of the completely cured imprint material 2 is formed on the semiconductor substrate 1. The method shown in FIGS. 1A to 2A is the patterning method according to this embodiment.

Figure 2B:
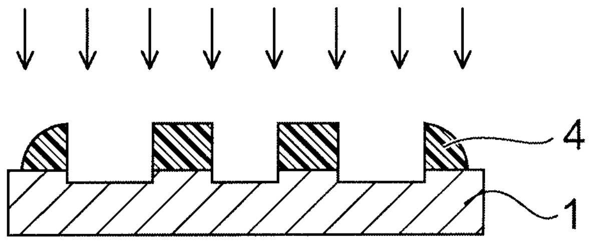

Next, as shown in FIG. 2B, the resin pattern 4 is used as a mask to perform processing on the semiconductor substrate 1. For instance, the resin pattern 4 is used as a mask to perform dry etching to selectively remove an upper portion of the semiconductor substrate 1. Alternatively, the resin pattern 4 is used as a mask to perform ion implantation to selectively implant impurity into an upper portion of the semiconductor substrate 1. By repeating such processing on the semiconductor substrate 1, a semiconductor device is manufactured. The semiconductor device is illustratively an LSI (large scale integrated circuit).

Next, the function and effect of this embodiment are described.

In this embodiment, in the process shown in FIG. 1B, with the template 3 pressed against the imprint material 2, it is irradiated with light of a wavelength of 365 nm to cause the first photosensitive material to react, and the imprint material 2 is turned into the semi-cured state. Thus, a fine pattern 2*a* is formed in the imprint material 2. Subsequently, in the process shown in FIG. 1C, the template 3 is stripped from the imprint material 2. At this time, because the imprint material 2 is in the semi-cured state, the fine pattern 2*a* is not destroyed. Furthermore, even after the template 3 is stripped, the fine pattern 2*a* is maintained without collapse. Next, in the process shown in FIG. 2A, the imprint material 2 is irradiated with light of a wavelength of 248 nm to cause the second photosensitive material to react, and the imprint material 2 is turned into the fully cured state. Thus, a hard resin pattern 4 can be obtained, and characteristics required for the resin pattern 4, such as etching resistance, can be ensured in the process using the resin pattern 4 as a mask shown in FIG. 2B.

In contrast, if, in the process shown in FIG. 1B, the imprint material 2 is turned into the fully cured state with the template 3 pressed against the imprint material 2, then when the template 3 is stripped from the imprint material 2, part of the imprint material 2 adheres to the template 3 and is fractured, destroying the fine pattern 2*a*. Furthermore, as the hardness of the imprint material 2 increases, its brittleness also increases. Hence, when the template 3 is stripped from the imprint material 2, the imprint material 2 may be deformed beyond its deformation limit and fractured, destroying the fine pattern 2*a* also in this case.

Furthermore, according to this embodiment, the imprint material contains two types of photosensitive materials which are cured by light of different wavelengths. Hence, the first photosensitive material and the second photosensitive material can be reacted independently. This makes it possible to cause, in the process shown in FIG. 1B, the reaction of nearly the total amount of the first photosensitive material, and substantially no reaction of the second photosensitive material. Consequently, the semi-cured state of the imprint material can be realized as the state in which only the first photosensitive material has reacted, and the second photosensitive material has not reacted. Thus, the semi-cured state can be realized uniformly and stably.

In contrast, if the imprint material contains only one type of photosensitive material to control the curing ratio by the amount of light irradiation, then because the amount of light reaching the imprint material varies with the formation density of the fine pattern of the template, the curing ratio varies with the difference in the formation density of the fine pattern, and the cured state of the imprint material becomes non-uniform with respect to position. Furthermore, various variations in the curing condition also cause variations in the average curing ratio of the entire imprint material.

Next, a specific example of this embodiment is described.

In this embodiment, it is possible to use an imprint material 2 in which, for instance, an acrylic resin is used as a base material, and an initiator having a photosensitive wavelength in the near-ultraviolet region and an initiator having a photosensitive wavelength in the ultraviolet region are mixed in this acrylic resin.

As an initiator having a photosensitive wavelength in the near-ultraviolet region, compounds with the absorption edge extending to around 400 nm can suitably be used, which include phosphine oxides such as 2,4,6-trimethylbenzoyl-diphenyl phosphine oxide (DAROCUR TPO, from Ciba-Geigy), phenylbis(2,4,6-trimethylbenzoyl)-phosphine oxide (IRGACURE 819, from Ciba-Geigy), and bis(2,6-dimethoxybenzoyl)-2,4,4-trimethyl-pentylphosphine oxide, thioxanthones such as 2,4-diethylthioxanthone, 2-chlorothioxanthone, and 1-chloro-4-propoxythioxanthone, ketones such as N-methylacridone, bis(dimethylaminophenyl) ketone, and 2-benzyl-2-dimethylamino-1-(4-morpholinophenyl)-butane-1-one (IRGACURE 369, from Ciba-Geigy), and oximes such as 1,2-octanedione-1-(4-(phenylthio)-2,2-(o-benzoyloxime)).

As an initiator having a photosensitive wavelength in the ultraviolet region, it is possible to use known initiators, including acetophenones, benzoins, benzophenones, ketals, and anthraquinones, such as 2,2-dimethoxy-1,2-diphenylethane-1-one (IRGACURE 651, from Ciba-Geigy), 1-hydroxycyclohexyl phenyl ketone (IRGACURE 184, from Ciba-Geigy), and 2-hydroxy-2-methyl-1-phenylpropane-1-one (IRGACURE 907, from Ciba-Geigy).

The resin used as a base material is not particularly limited. For instance, it is possible to use polyethylene, polypropylene, polyvinyl alcohol, polyvinylidene chloride, polyethylene terephthalate, polyvinyl chloride, polystyrene, ABS resin, AS resin, acrylic resin, polyamide, polyacetal, polybutylene terephthalate, glass-reinforced polybutylene terephthalate, polycarbonate, modified polyphenylene ether, polyphenylene sulfide, polyether ether ketone, liquid crystalline polymer, fluororesin, polyarylate, polysulfone, polyether sulfone, polyamide-imide, polyether imide, phenol resin, melamine resin, urea resin, epoxy resin, unsaturated polyester resin, alkyd resin, silicone resin, diallyl phthalate resin, polyamide bismaleimide, and polybisamide triazole, or a mixture of two or more of these resins.

Next, a second embodiment of the invention is described.

This embodiment is different from the above first embodiment in that a thermosetting material with two types of thermal cross-linking materials mixed therein is used as an imprint material to form a resin pattern by a thermal imprint process. More specifically, the imprint material used in this embodiment contains a first thermal cross-linking material reacting at a temperature of e.g. 50° C. and a second thermal cross-linking material reacting at a temperature of e.g. 150° C.

In the following, a method for manufacturing a semiconductor device according to this embodiment is described with reference to FIGS. 1A to 2B described earlier.

First, as shown in FIG. 1A, an uncured imprint material 2 is applied onto a semiconductor substrate 1, and a template 3 is pressed against this imprint material 2 to emboss it. The template 3 is formed from a material resistant to the reaction temperature of the aforementioned second thermal cross-linking material, i.e., a temperature of 150° C.

Next, in the process shown in FIG. 1B, the structure made of the semiconductor substrate 1, the imprint material 2, and the template 3 is heated to a temperature of e.g. 50° C. Thus, the first thermal cross-linking material reacts, but the second thermal cross-linking material does not react. Hence, the imprint material 2 is turned into a semi-cured state. Next, as shown in FIG. 1C, the template 3 is stripped from the imprint material 2.

Next, in the process shown in FIG. 2A, the semiconductor substrate 1 and the imprint material 2 are heated to a temperature of e.g. 150° C. This causes the second thermal cross-linking material to react, and the imprint material 2 is turned into the fully cured state. Consequently, a hard resin pattern 4 is formed. Subsequently, as shown in FIG. 2B, the resin pattern 4 is used as a mask to perform processing on the semiconductor substrate 1 to manufacture a semiconductor device. The manufacturing method of this embodiment other than the foregoing is similar to that of the above first embodiment.

Also in this embodiment, like the above first embodiment, with the template 3 pressed, the imprint material 2 is turned into the semi-cured state, and the template 3 is stripped. Subsequently, the imprint material is turned into the fully cured state. This can prevent the fine pattern 2*a* of the imprint material 2 from being destroyed in connection with stripping of the template 3. Furthermore, the imprint material contains two types of thermal cross-linking materials having different curing temperatures. Hence, in the process shown in FIG. 1B, only the first thermal cross-linking material can be reacted, and the semi-cured state of the imprint material can be realized uniformly and stably as the state in which only the first thermal cross-linking material has reacted. The function and effect of this embodiment other than foregoing are similar to those of the above first embodiment.

Next, a specific example of this embodiment is described.

In this embodiment, as the imprint material 2, it is possible to use a two-liquid composition in which, for instance, an acrylic resin is used as a base material, and two types of thermal cross-linking materials are mixed in this acrylic resin.

With regard to the first thermal cross-linking material, for instance, DINP (diisononyl phthalate) and epoxy resin can be used. Dicyandiamide can be used as a curing agent for epoxy resin. Furthermore, imidazole-based compounds can be used as a curing accelerator. As the second thermal cross-linking material, for instance, it is possible to use known curing agents, including amines such as aliphatic amine, aromatic amine, and modified amine, indazoles, polymercaptane curing agent, acid anhydrides such as aromatic acid anhydride, alicyclic acid anhydride, and aliphatic acid anhydride, boron trifluoride-amine complex, dicyandiamide, and organic hydrazide.

The resin used as a base material is not particularly limited. For instance, it is possible to use polyethylene, polypropylene, polyvinyl alcohol, polyvinylidene chloride, polyethylene terephthalate, polyvinyl chloride, polystyrene, ABS resin, AS resin, acrylic resin, polyamide, polyacetal, polybutylene terephthalate, glass-reinforced polybutylene terephthalate, polycarbonate, modified polyphenylene ether, polyphenylene sulfide, polyether ether ketone, liquid crystalline polymer, fluororesin, polyarylate, polysulfone, polyether sulfone, polyamide-imide, polyether imide, phenol resin, melamine resin, urea resin, epoxy resin, unsaturated polyester resin, alkyd resin, silicone resin, diallyl phthalate resin, polyamide bismaleimide, and polybisamide triazole, or a mixture of two or more of these resins.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the invention.

For instance, in the above embodiments, two types of photosensitive materials reacting to light of different wavelengths, or two types of thermal cross-linking materials reacting at different temperatures, are illustratively mixed in the imprint material. However, the invention is not limited thereto, as long as the imprint material contains two or more types of curing agents which are cured under different curing conditions. For instance, the imprint material may contain one type of photosensitive material and one type of thermal cross-linking material. With the template pressed, light or heat may be applied to turn the imprint material into a semi-cured state. Subsequently, after the template is stripped, heat or light may be applied to turn the imprint material into the fully cured state. Furthermore, the imprint material may contain three or more types of curing agents.

In the above embodiments, the formed resin pattern is illustratively used to manufacture a semiconductor device. However, the invention is not limited thereto. The pattern formed by the method according to the invention can be suitably used to manufacture any fine structure which can be manufactured by the nano-imprint process. For instance, it is possible to manufacture various types of biodevice, printed circuit board, semiconductor multilayer wiring, optical storage, magnetic storage, optical devices such as microlens and polarization element, LCD (liquid crystal display), and FED (field emission display).

The invention claimed is:

1. A patterning method comprising:

applying an uncured imprint material containing a first curing agent and a second curing agent onto a substrate;

pressing a template against the imprint material;

reacting the first curing agent with the template pressed against the imprint material;

stripping the template from the imprint material; and reacting the second curing agent, wherein:

the first curing agent is a photosensitive material reacting upon irradiation of light of a first wavelength, the second curing agent is a photosensitive material reacting upon irradiation of light of a second wavelength, the reacting the first curing agent includes irradiating the imprint material with light of the first wavelength, and the reacting the second curing agent includes irradiating the imprint material with light of the second wavelength.

2. The method according to claim 1, wherein the first wavelength is longer than the second wavelength.

3. The method according to claim 2, wherein the light of the first wavelength is near-ultraviolet radiation, and the light of the second wavelength is ultraviolet radiation.

4. The method according to claim 1, wherein the first curing agent is one initiator selected from the group consisting of phosphine oxides, ketones, and oximes.

5. The method according to claim 1, wherein the second curing agent is one initiator selected from the group consisting of acetophenones, benzoins, benzophenones, ketals, and anthraquinones.

6. A patterning method comprising:

applying an uncured imprint material containing a first curing agent and a second curing agent onto a substrate;

pressing a template against the imprint material;

reacting the first curing agent with the template pressed against the imprint material;

stripping the template from the imprint material; and reacting the second curing agent, wherein:

the first curing agent is a thermal cross-linking material reacting upon heating to a first temperature, the second curing agent is a thermal cross-linking material reacting upon heating to a second temperature higher than the first temperature, the reacting the first curing agent includes heating the imprint material to the first temperature, and the reacting the second curing agent includes heating the imprint material to the second temperature.

7. A patterning method comprising:

applying an uncured imprint material containing a first curing agent and a second curing agent onto a substrate;

pressing a template against the imprint material;

reacting the first curing agent with the template pressed against the imprint material;

stripping the template from the imprint material; and reacting the second curing agent, wherein base material of the imprint material is one resin selected from the group consisting of polyethylene, polypropylene, polyvinyl alcohol, polyvinylidene chloride, polyethylene terephthalate, polyvinyl chloride, polystyrene, ABS resin, AS resin, acrylic resin, polyamide, polyacetal, polybutylene terephthalate, glass-reinforced polybutylene terephthalate, polycarbonate, modified polyphenylene ether, polyphenylene sulfide, polyether ether ketone, liquid crystalline polymer, fluororesin, polyarylate, polysulfone, polyether sulfone, polyamide-imide, polyether imide, phenol resin, melamine resin, urea resin, epoxy resin, unsaturated polyester resin, alkyd resin, silicone resin, diallyl phthalate resin, polyamide bismaleimide, and polybisamide triazole, or a material in which two or more of the resins selected from the group are mixed.

8. A method for manufacturing a semiconductor device, comprising:

forming a pattern on a semiconductor substrate; and performing processing on the semiconductor substrate by using the pattern as a mask, the forming the pattern including:

applying an uncured imprint material containing a first curing agent and a second curing agent onto the substrate;

pressing a template against the imprint material;

reacting the first curing agent with the template pressed against the imprint material;

stripping the template from the imprint material; and reacting the second curing agent, wherein:

the first curing agent is a photosensitive material reacting upon irradiation of light of a first wavelength, the second curing agent is a photosensitive material reacting upon irradiation of light of a second wavelength, the reacting the first curing agent includes irradiating the imprint material with light of the first wavelength, and the reacting the second curing agent includes irradiating the imprint material with light of the second wavelength.

9. The method according to claim 8, wherein the first wavelength is longer than the second wavelength.

10. The method according to claim 9, wherein the light of the first wavelength is near-ultraviolet radiation, and the light of the second wavelength is ultraviolet radiation.

11. The method according to claim 8, wherein the first curing agent is one initiator selected from the group consisting of phosphine oxides, ketones, and oximes.

12. The method according to claim 8, wherein the second curing agent is one initiator selected from the group consisting of acetophenones, benzoins, benzophenones, ketals, and anthraquinones.

13. A method for manufacturing a semiconductor device, comprising:

forming a pattern on a semiconductor substrate; and performing processing on the semiconductor substrate by using the pattern as a mask, the forming the pattern including:

applying an uncured imprint material containing a first curing agent and a second curing agent onto the substrate;

pressing a template against the imprint material;

reacting the first curing agent with the template pressed against the imprint material;

stripping the template from the imprint material; and reacting the second curing agent, wherein:

one of the first curing agent and the second curing agent is a photosensitive material reacting upon irradiation of light of a prescribed wavelength, the other of the first curing agent and the second curing agent is a thermal cross-linking material reacting upon heating to a prescribed temperature, the reacting the first curing agent includes irradiating the imprint material with light of the prescribed wavelength or heating the imprint material to the prescribed temperature, and the reacting the second curing agent includes heating the imprint material to the prescribed temperature or irradiating the imprint material with light of the prescribed wavelength.

14. A method for manufacturing a semiconductor device, comprising:

forming a pattern on a semiconductor substrate; and performing processing on the semiconductor substrate by using the pattern as a mask, the forming the pattern including:

applying an uncured imprint material containing a first curing agent and a second curing agent onto the substrate;

pressing a template against the imprint material;

reacting the first curing agent with the template pressed against the imprint material;

stripping the template from the imprint material; and reacting the second curing agent, wherein base material of the imprint material is one resin selected from the group consisting of polyethylene, polypropylene, polyvinyl alcohol, polyvinylidene chloride, polyethylene terephthalate, polyvinyl chloride, polystyrene, ABS resin, AS resin, acrylic resin, polyamide, polyacetal, polybutylene terephthalate, glass-reinforced polybutylene terephthalate, polycarbonate, modified polyphenylene ether, polyphenylene sulfide, polyether ether ketone, liquid crystalline polymer, fluororesin, polyarylate, polysulfone, polyether sulfone, polyamide-imide, polyether imide, phenol resin, melamine resin, urea resin, epoxy resin, unsaturated polyester resin, alkyd resin, silicone resin, diallyl phthalate resin, polyamide bismaleimide, and polybisamide triazole, or a material in which two or more of the resins are mixed.

* * * * *